United States Patent
Helder et al.

(10) Patent No.: US 8,520,428 B2
(45) Date of Patent: Aug. 27, 2013

(54) COMBINED DATA LEVEL-SHIFTER AND DE-SKEWER

(75) Inventors: Edward E. Helder, Fremont, CA (US); Brandon M. Walters, Sunnyvale, CA (US); Mahesh M. Chheda, Santa Clara, CA (US); Shenggao Li, Pleasanton, CA (US); Kenneth R. Smits, San Ramon, CA (US)

(73) Assignee: Intel Corporation, Santa Clara, CA (US)

( * ) Notice: Subject to any disclaimer, the term of this patent is extended or adjusted under 35 U.S.C. 154(b) by 235 days.

(21) Appl. No.: 13/072,375

(22) Filed: Mar. 25, 2011

(65) Prior Publication Data
US 2012/0243300 A1    Sep. 27, 2012

(51) Int. Cl.
*G11C 11/00* (2006.01)

(52) U.S. Cl.
USPC .............. 365/154; 365/189.11; 365/230.06

(58) Field of Classification Search
USPC ............ 365/154, 189.11, 230.06, 226, 149, 365/222, 201, 233, 196, 207, 189.04, 230.05, 365/230.02
See application file for complete search history.

(56) References Cited

U.S. PATENT DOCUMENTS

| | | | |
|---|---|---|---|
| 6,799,280 B1 * | 9/2004 | Edenfield et al. | 713/400 |
| 2001/0030888 A1 * | 10/2001 | Chang | 365/185.03 |
| 2002/0040424 A1 | 4/2002 | Kumazawa | |
| 2002/0191479 A1 * | 12/2002 | Yamauchi et al. | 365/233 |
| 2006/0023825 A1 * | 2/2006 | Kato et al. | 375/372 |
| 2007/0234100 A1 | 10/2007 | Baker et al. | |
| 2009/0109770 A1 | 4/2009 | Sugishita | |
| 2010/0205386 A1 | 8/2010 | Yamashita | |
| 2011/0158030 A1 * | 6/2011 | Bae et al. | 365/233.1 |

OTHER PUBLICATIONS

International Search Report and Written Opinion for PCT/US2012/026772, mailed Dec. 17, 2012, 6 pages.

\* cited by examiner

*Primary Examiner* — Dang Nguyen
(74) *Attorney, Agent, or Firm* — Schwabe, Williamson & Wyatt, P.C.

(57) ABSTRACT

Various embodiments of this disclosure may describe a circuit for transmitting data from a transmitting region of an integrated circuit to a receiving region of the integrated circuit. The circuit may level-shift the data to the appropriate voltage level and may have good tolerance to clock skews. Other embodiments, including an integrated circuit having the circuit or a system with the integrated circuit, may also be disclosed or claimed.

18 Claims, 5 Drawing Sheets ced clock gen-
COMBINED DATA LEVEL-SHIFTER AND DE-SKEWER

TECHNICAL FIELD

The present disclosure generally relates to integrated circuits, in particular, to data transmission within an integrated circuit.

BACKGROUND

Unless otherwise indicated herein, the materials described in this section are not prior art to the claims in this application and are not admitted to be prior art by inclusion in this section.

Various components of a traditional computer system may be integrated into a single integrated circuit (IC). The IC may comprise several regions that are each dedicated to a specific functionality, such as a memory controller (MC) region and a double data rate (DDR) input/output (I/O) region. Data may be transmitted from the MC region to the DDR I/O region via, for example, flip-flop based FIFOs or shift registers. The two regions may operate under the same clock frequency. However, for various reasons, the clocks of the two regions may originate from different clock sources, e.g., different Phase Locked Loop (PLL) clock sources. Under certain circumstances, the clock skews between the two regions may be greater than 50% of each clock cycle. In order to accommodate the clock skew, additional setup and hold time tolerance may be required for the flip-flop based FIFOs to transfer data between the two regions in a consistent manner. The increased setup and hold timing requirements may cause extra delay in the path of data transmission, which may be undesirable, especially if the data transmission between the two regions is latency critical.

Furthermore, the two regions of the IC may operate under different voltage levels. As such, data may need to be level-shifted after entering the receiving region. Level-shifting the data using separate circuit blocks may further increase the delay.

BRIEF DESCRIPTION OF THE DRAWINGS

Embodiments of the present disclosure will be described by way of exemplary illustrations, but not limitations, shown in the accompanying drawings in which like references denote similar elements, and in which.

DETAILED DESCRIPTION OF ILLUSTRATIVE EMBODIMENTS

In the following detailed description, reference is made to the accompanying drawings which form a part hereof, and in which are shown by way of illustration embodiments in which the disclosure may be practiced. It is to be understood that other embodiments may be utilized and structural or logical changes may be made without departing from the scope of the present disclosure. Therefore, the following detailed description is not to be taken in a limiting sense, and the scope of embodiments in accordance with the present disclosure is defined by the appended claims and their equivalents.

Various operations may be described as multiple discrete operations in turn, in a manner that may be helpful in understanding embodiments of the present disclosure; however, the order of description should not be construed to imply that these operations are order dependent.

For the purposes of the description, a phrase in the form "A/B" or in the form "A and/or B" means (A), (B), or (A and B). For the purposes of the description, a phrase in the form "at least one of A, B, and C" means (A), (B), (C), (A and B), (A and C), (B and C), or (A, B and C). For the purposes of the description, a phrase in the form "(A)B" means (B) or (AB) that is, A is an optional element.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The description may use various terms, such as "transistor," "inverter," "flip-flop," and "latch," etc., to represent various components used in various embodiments. It is understood that these components may be implemented in various ways and/or be replaced by components of similar functionality. For example, a "latch" may be implemented based on parts of one or more flip-flops, or vice versa. Similarly, an "inverter" may be based on a plurality of transistors. Further, these components may be integrated into a single Application Specific Integrated Circuit (ASIC), Field Programmable Gated Array (FPGA), etc. Therefore, the terms used throughout this disclosure are for purpose of illustration only, not to be construed as limitations.

Various embodiments of this disclosure may describe a circuit for transmitting data from a transmitting region of an integrated circuit to a receiving region of the integrated circuit. The circuit may level-shift the data to the appropriate voltage level and may have good tolerance to clock skews.

Figure 1:
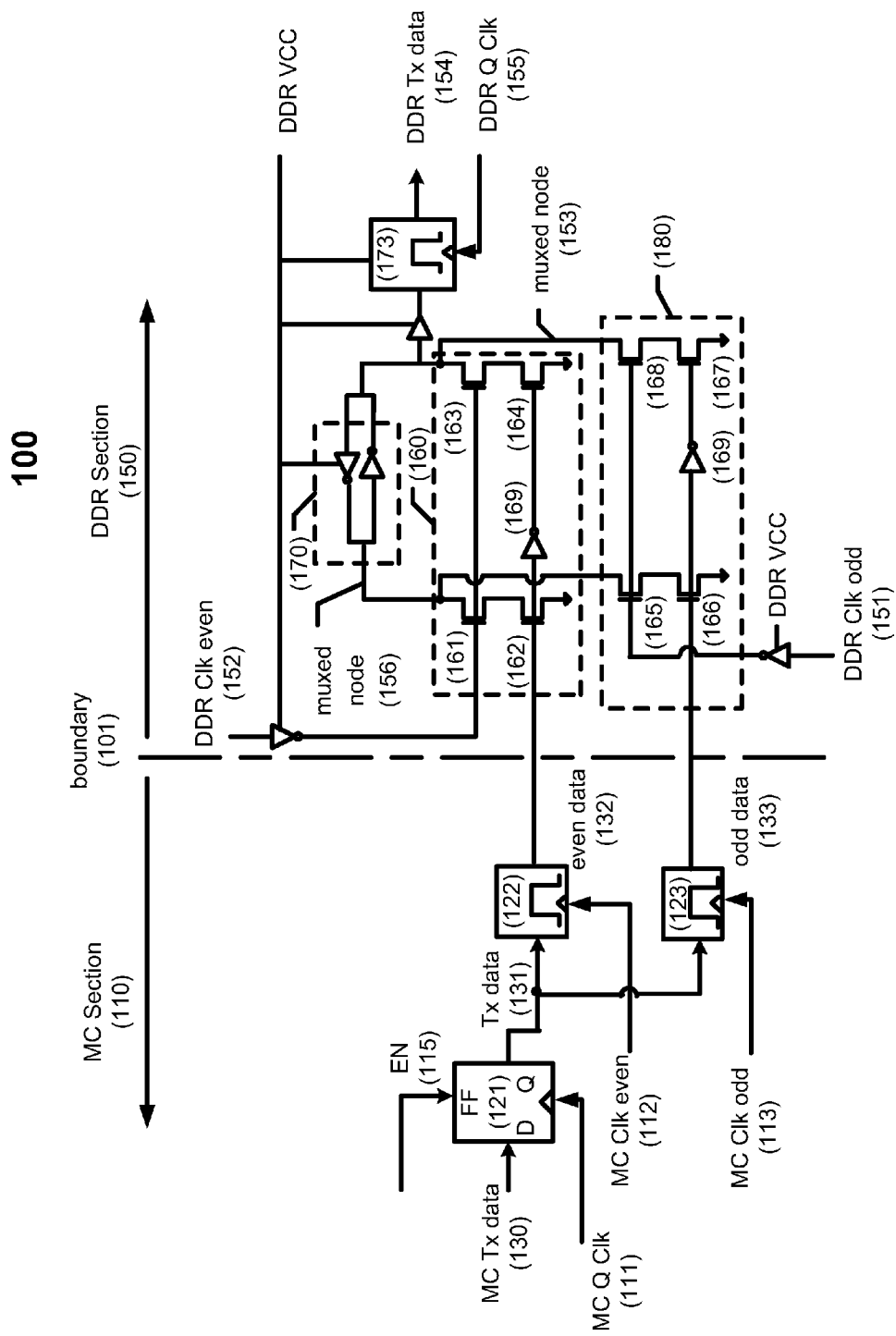
FIG. 1 is a block diagram illustrating a circuit for data transmission between two regions of an integrated circuit, in accordance with various embodiments of the present disclosure.

FIG. 1 is a block diagram illustrating a circuit 100 for data transmission between two regions of an integrated circuit, in accordance with various embodiments of the present disclosure. For the embodiments, an integrated circuit (IC) may include a transmitting region 110, and a receiving region 150. The two regions may be distinguished by an artificial boundary line, illustrated as the dashed line 101 in FIG. 1. To the left of the boundary 101 may be the transmitting region 110. The transmitting region 110 may, for example, be a memory controller (MC) region of the IC. To the right of the boundary 101 may be a receiving region 150. The receiving region 150 may, for example, be a double data rate input/output (DDR I/O) region of the IC. The circuit 100 may also be used for data transmission among other regions of the IC.

In various embodiments of the present disclosure, the transmitting region 110 may be associated with a clock source (not shown) that provides a clock signal 111, and the receiving region 150 may be associated with another clock source (not shown) that provides a clock signal 155. The clock signal 111 and the clock signal 155 may have the same frequency. However, the clock signal 111 and the clock signal 155, relative to each other, may be skewed in time and/or in phase.

In various embodiments of the present disclosure, the transmitting region 110 and the receiving region 150 may operate under different voltage levels. For example, components of the transmitting region 110 may, in general, operate under a first voltage level, while components of the receiving region 150 may, in general, operate under a second voltage level, which may be higher or lower than the first voltage level. However, certain exceptions may also apply, as will be discussed in more details in later parts of this disclosure.

In various embodiments of the present disclosure, the circuit 100 may propagate a data signal 130 from the transmitting region 110 to the receiving region 150. At the transmitting region, the circuit 100 may include latches 122 and 123, and optionally a flip-flop 121. The flip-flop 121 may be configured to receive the clock signal 111 at the Q terminal of the flip-flop 121. The flip-flop 121 may sync the data signal 130 against the clock signal 111 and produce a data signal 131. The data signal 131 may then be provided to latches 122 and 123. In some embodiments of the present disclosure, the flip-flop 121 may be replaced by a latch, or similar components. In some other embodiments of the present disclosure, the data signal 130 may be communicatively coupled with the latches 122 and 123 directly, without going through the flip-flop 121.

In various embodiments of the present disclosure, the latch 122 may be configured to receive a clock signal 112, and configured to output a data signal 132. The clock signal 112 may be based on the clock signal 111. In particular, the clock signal 112 may be a clock signal that tracks even clock cycles of the clock signal 111. For example, if the clock signal 111 pulses high at times 0, 1, 2, 3, 4, 5, 6 . . . , then the clock signal 112 may first pulse high at, or shortly after, the time 0, and may not pulses high again until, or shortly after, at the times 2, 4, 6, so on and so forth. Accordingly, the latch 122 may capture the data signal 131 at each and every even clock cycles of the clock signal 111. In between these even clock cycles, the data signal 132 may stay at that data level until the next even clock cycle of the clock signal 111 starts. In other words, the clock signal 112 may be a snapshot of the clock signal 111 for all the even clock cycles, and the data signal 132 may be a snapshot of the data signal 131 during even clock cycles of the clock signal 111.

Similarly, the latch 123 may be configured to receive a clock signal 113, and configured to output a data signal 133. The clock signal 113 may be based on the odd clock cycles of the clock signal 111, and may pulse high at, or shortly after the clock signal 111 pulses high at the times 1, 3, 5, etc. The data signal 133 may be a snapshot of the data signal 131 during odd clock cycles of the clock signal 111.

In some embodiments of the present disclosure, as the above examples indicated, both the latches 122 and 123 may be transparent-high latches, meaning that the output of the latches 122 and 123 may follow the rising edges of a clock signal 112 and a clock signal 113, respectively. In other embodiments, transparent-low latches, a combination of transparent-high and transparent-low latches, or some other types of latches may also be used, so long as the clock signals 112 and 113 are accordingly adjusted.

In various embodiments of the present disclosure, at the receiving region 150, the circuit 100 may include a memory cell 170, a first circuit cell 160, a second circuit cell 180, and an optional latch 173. The memory cell 170, and the circuit cells 160 and 180 are illustrated as dash-lined boxes in FIG. 1.

In various embodiments of the present disclosure, the memory cell 170 may be coupled to the circuit cells 160 and 180. The memory cell 170 may include an input node 156 and an output node 153. The memory cell 170 may include components configured to store a signal, similar to a static or dynamic random access memory (RAM) cell, or some other types of memory cell. In some embodiments, for example, as illustrated, the memory cell 170 may include two inverters circularly coupled to form an inverter feedback loop, which may function similar to a static RAM (SRAM) cell.

In various embodiments of the present disclosure, the circuit cell 160 may comprise transistors 161, 162, 163, and 164. As illustrated, in various embodiments, transistors 161-164 may be N-type transistors. The source terminal of the transistor 161 may be coupled to the drain terminal of the transistor 162, and the source terminal of the transistor 163 may be coupled to the drain terminal of the transistor 164. The drain terminal of the transistor 161 may be coupled to the input node 156 of the memory cell 170, and the drain terminal of the transistor 163 may be coupled to the output node 153 of the memory cell 170. The source terminals of the transistors 162 and 164 may be coupled to $V_{ss}$, or ground. In other embodiments of the present disclosure, transistors 161-164 may also be P-type transistors, and the various terminals of the transistors 161-164 may be accordingly arranged, as understood by person of ordinary skill in the art.

In various embodiments of the present disclosure, the transistor 161 may be configured to receive a clock signal 152 via its gate terminal. Similar to the clock signal 112 of the transmitting region, the clock signal 152 may be a clock signal that is synced against the even clock cycles of the clock signal 155. In certain embodiments, as illustrated, depending on whether the clock signal 155 pulses high or low, the transistor 161 may be configured to receive an inverted clock signal 152.

In various embodiments of the present disclosure, the transistor 162 may be configured to receive the data signal 132 at its gate terminals. Depending on the clock signal 152, when the voltage level at the gate terminal of the transistor 161 is high, the transistor 161 may be turned on, thereby electrically coupling the transistor 162 with the input node 156 of the memory cell 170. If the data signal 132 is high (e.g., data signal 132 is a "1"), the transistor 162 may be turned on, thereby pulling down the voltage level at the input node 156 of the memory cell 170, and producing a high at the output node 153 (e.g., output node 153 is also a "1").

The transistor 163 may be configured to receive the clock signal 152 via its gate terminal. The transistor 164 may be configured to receive an inverted version of the data signal 132 at its gate terminal, via the inverter 169. Depending on the clock signal 152, when the voltage level at the gate terminal of the transistor 163 is high, the transistor 163 may be turned on, thereby electrically coupling the transistor 164 with the output node 153 of the memory cell 170. If the data signal 132 is low (e.g., data signal 132 is a "0"), due to the inverter 169, the transistor 162 may be turned on, thereby pulling down the voltage level at the output node 153 of the memory cell 170, and producing a low at the output node 153 (e.g., output node 153 is also a "0").

When the voltage level at the gate terminals of the transistors 161 and 163 is low, the transistors 161 and 163 may be turned off, thereby disconnecting the transistors 162 and 164 from the memory cell 170, and isolating the data signal 132 from the output of the memory cell 170. Accordingly, depending on the clock signal 152, the transistors 161-164 may cooperatively cause the memory cell 170 to produce an output signal at the output node 153 that is a delayed version of the data signal 132. Furthermore, the output signal at the node 153 may be level-shifted to the voltage level of the receiving region 150.

In various embodiments of the present disclosure, the second circuit cell 180 may be configured to receive the data signal 133. Similar to the circuit cell 160, the circuit cell 180 may include transistors 165-168 and may be similarly configured as the transistors 161-164 in the circuit cell 160. The transistors 165 and 168, however, may be configured to receive a clock signal 151 that is based on the odd clock cycles of the clock signal 155. Depending on the clock signal 151, similar to the transistors 161-164, the transistor 165-168 may cooperatively cause the memory cell 170 to produce an output signal at the output node 153 that is a delayed version of the data signal 133. Accordingly, the signal at the output node 153 may be based on the data signal 132 during the even clock cycles of the clock signal 155, and based on the data signal 133 during the odd clock cycles of the clock signal 155. When the even and odd clock cycles of the signal 155 is multiplexed at the output node 153, the output signal at the node 153 may be a delayed and level-shifted version of the data signal 130 from the transmitting region.

In various embodiments of the present disclosure, as illustrated, the latch 173 may be coupled to the multiplexed output node 153, and configured to receive the clock signal 155. The latch 173 may further stabilize the output signal and produce a data signal 154. After being level-shifted and clock deskewed, the data signal 154 may then propagate through the rest of the receiving region 150. In other embodiments, the latch 173 may not be necessary.

Although most of the components on the side of the receiving region 150 may operate under the voltage level of the receiving region 150, in various embodiments of the present disclosure, the transistors 162, 164, 166, and 168 may receive, at their gate terminals, a signal under the voltage level of the transmitting region 110. In various embodiments, transistors 162, 164, 166, and 168 may be configured based on the difference between the voltage level of the transmitting region 110 and the receiving region 150. Furthermore, even though the transistors 161-168 are illustrated as N-type transistors, the transistors 161-168 may be P-type transistors, or a mix of both N-type and P-type transistors. The transistors 161-168 may or may not have the same size.

Figure 2:
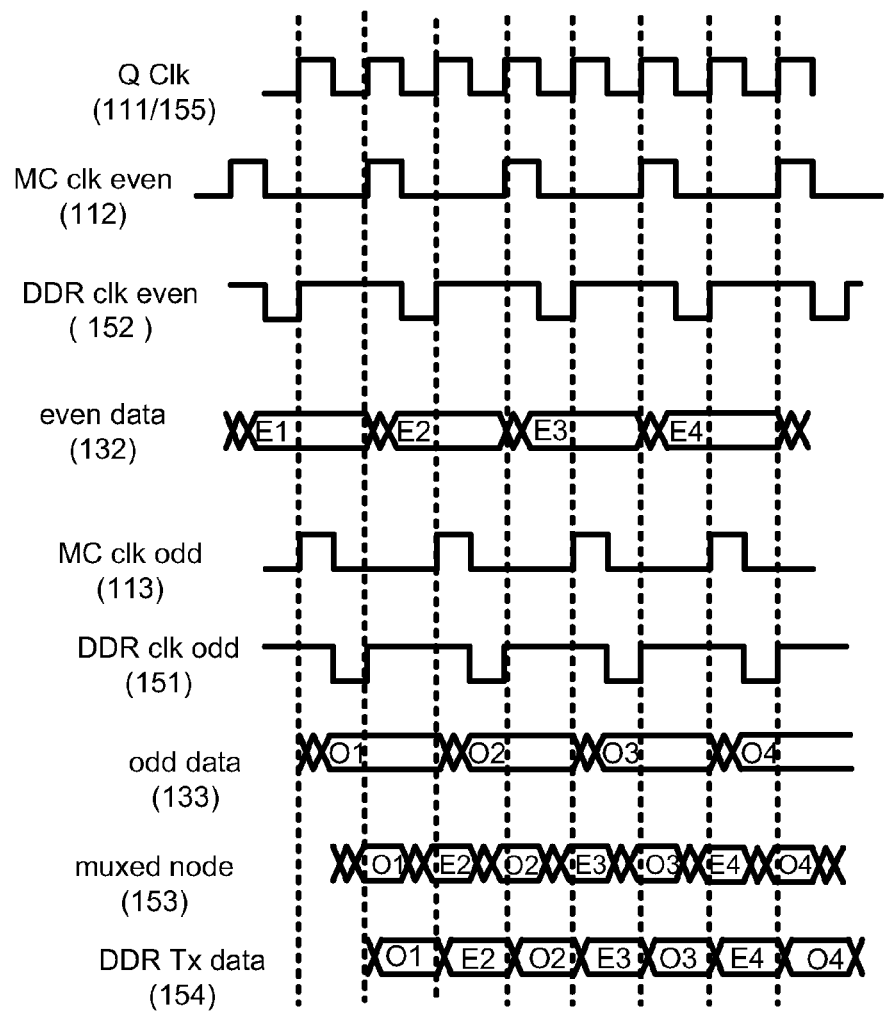
FIG. 2 is a timing diagram illustrating various waveforms of signals propagating through the circuit, in accordance with various embodiments of the present disclosure.

FIG. 2 is a timing diagram illustrating various waveforms of signals propagating through the circuit 100, in accordance with various embodiments of the present disclosure. Waveforms for the clock signals 111, 112, 152, 113, and 151, and the data signals 132, 133, and the output signal of the memory cell 170 at the output node 153, and the data signal 154 are illustrated. In various embodiments of the present disclosure, the clock signals 112, 113, 152 and 151 may pulse either high or low. For example, as illustrated in FIG. 2, the clock signals 112 and 113 may pulse high, while the clock signals 152 and 151 may pulse low.

In various embodiments of the present disclosure, as illustrated, in an ideal situation when no clock skew is present between the transmitting region 110 and the receiving region 150, the clock signal 111 of the transmitting region and the clock signal 155 of the receiving region may be identical. Furthermore, pulses of the clock signal 152 may follow the pulses of the clock signal 112, and pulses of the clock signal 151 may follow the pulses of the clock signal 113. As such, the clock signals 112, 152, 113, and 151 may interleave each other. For example, in a first clock cycle, the clock signals 113 and 151 may stay flat, while the clock signal 112 may pulse high or low during the first half of the clock cycle, and the clock signal 152 may pulse high or low during the second half of the clock cycle. In the second clock cycle, the clock signals 112 and 152 may stay flat, while the clock signal 113 may pulse high or low at the first half of the clock cycle, and the clock signal 151 may pulse high or low at the second half of the clock cycle.

In various embodiments of the present disclosure, when there is clock skew between the transmitting region 110 and the receiving region 150, the circuit 100 may show a large hold and setup skew tolerance. To demonstrate hold skew tolerance, the clock signal 112 may slide earlier than its corresponding clock signal 152. The data signal at the output node 153 may still be at the correct value, so long as the clock signal 112 is not earlier than the clock signal 152 for more than a clock cycle. Similarly, the data signal at the output node 153 may still be at the correct value, so long as the clock signal 113 is not earlier than the clock signal 151 for more than a clock cycle. To demonstrate setup skew tolerance, the clock signals 112 and 113 may slide later than the clock signals 152, 151, respectively. The data signal at the output node 153 may still be at the correct value, so long as the clock signals 112 or 113 are not later than the clock signals 152 or 151 for more than half of a clock cycle, assuming the flip-flop 121 is located close to the receiving region. Accordingly, the circuit 100 may have a hold skew tolerance of near a full clock cycle, and a setup skew tolerance of near a half clock cycle. In various embodiments, the setup skew tolerance may be related to the clock cycle and the data propagation delay. As such, the setup skew tolerance may be more or less than a half clock cycle.

Figure 3:
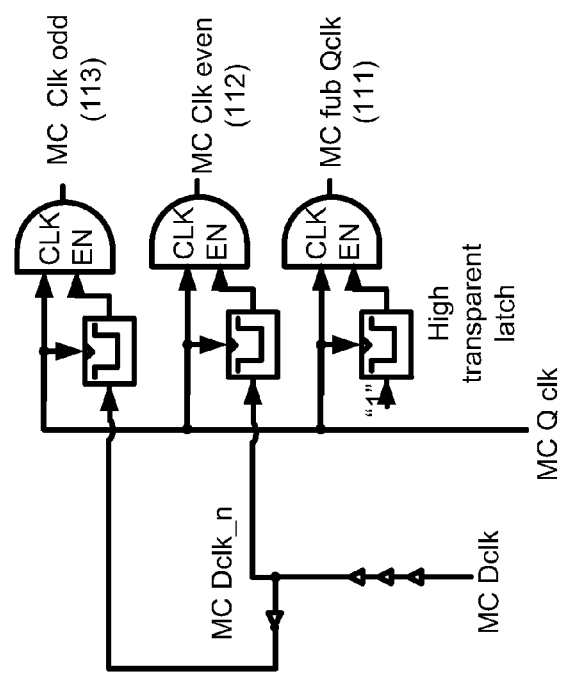
FIG. 3 is a block diagram illustrating a shaped clock generator for a transmitting region of the integrated circuit, in accordance with various embodiments of the present disclosure.

FIG. 3 is a block diagram illustrating a shaped clock generator 300 for the transmitting region 110 of the integrated circuit, in accordance with various embodiments of the present disclosure. The shaped clock generator 300 may produce clock signals similar to the clocks signals 111, 112, and 113 as illustrated in FIG. 2. In various embodiments of the present disclosure, other clock generators may be used, so long as the appropriate clock waveforms are produced.

Figure 4:
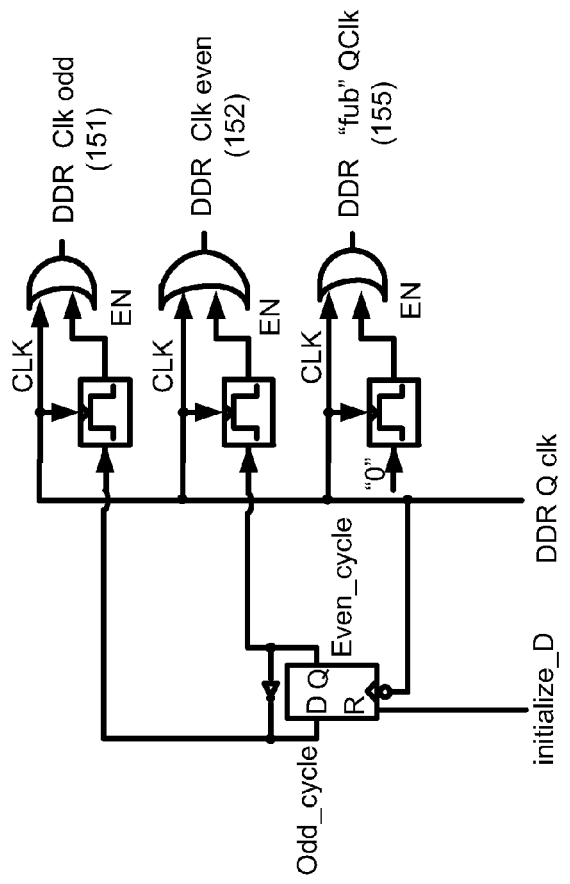
FIG. 4 is a block diagram illustrating a shaped clock generator for a receiving region of the integrated circuit, in accordance with various embodiments of the present disclosure.

FIG. 4 is a block diagram illustrating a shaped clock generator 400 for the receiving region 150 of the integrated circuit, in accordance with various embodiments of the present disclosure. The shaped clock generator 400 may produce clock signals similar to the clock signals 151, 152, and 155 as illustrated in FIG. 2. In various embodiments of the present disclosure, other clock generators may be used, so long as the appropriate clock waveforms are produced.

Figure 5:
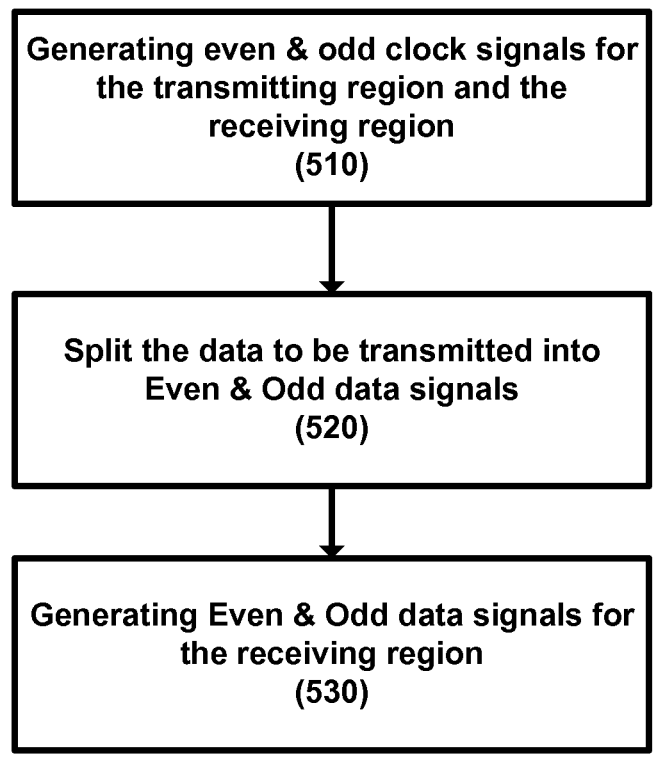
FIG. 5 is a flow diagram illustrating a portion of the operations of the circuit for data transmission between two regions of the integrated circuit, in accordance with various embodiments of the present disclosure.

FIG. 5 is a flow diagram illustrating a portion of the operations of the circuit 100 for data transmission between two regions of the integrated circuit, in accordance with various embodiments of the present disclosure. In block 510, a first shaped clock generator may generate the even and odd clock signals 112 and 113 for the transmitting region 110, and a second shaped clock generator may generate the even and odd clock signals 152 and 151 for the receiving region 150. In block 520, a data signal 132 corresponding to the even clock signal 112, and a data signal 133 corresponding to the odd clock signal 113, may be generated by the latches 122 and 133 based on the data signal 131 or 130 as previously described. In block 530, the circuit cell 160 may interact with the memory cell 170, based on the even clock signal 152, to produce a first output signal based on the data signal 132. The circuit cell 180 may interact with the memory cell 170, based on the odd clock signal 151, to produce a second output signal based on the data signal 133. The first and the second output signal, level-shifted by the circuit 100, multiplexed at the node 153, may then propagate through the receiving region 150.

Figure 6:
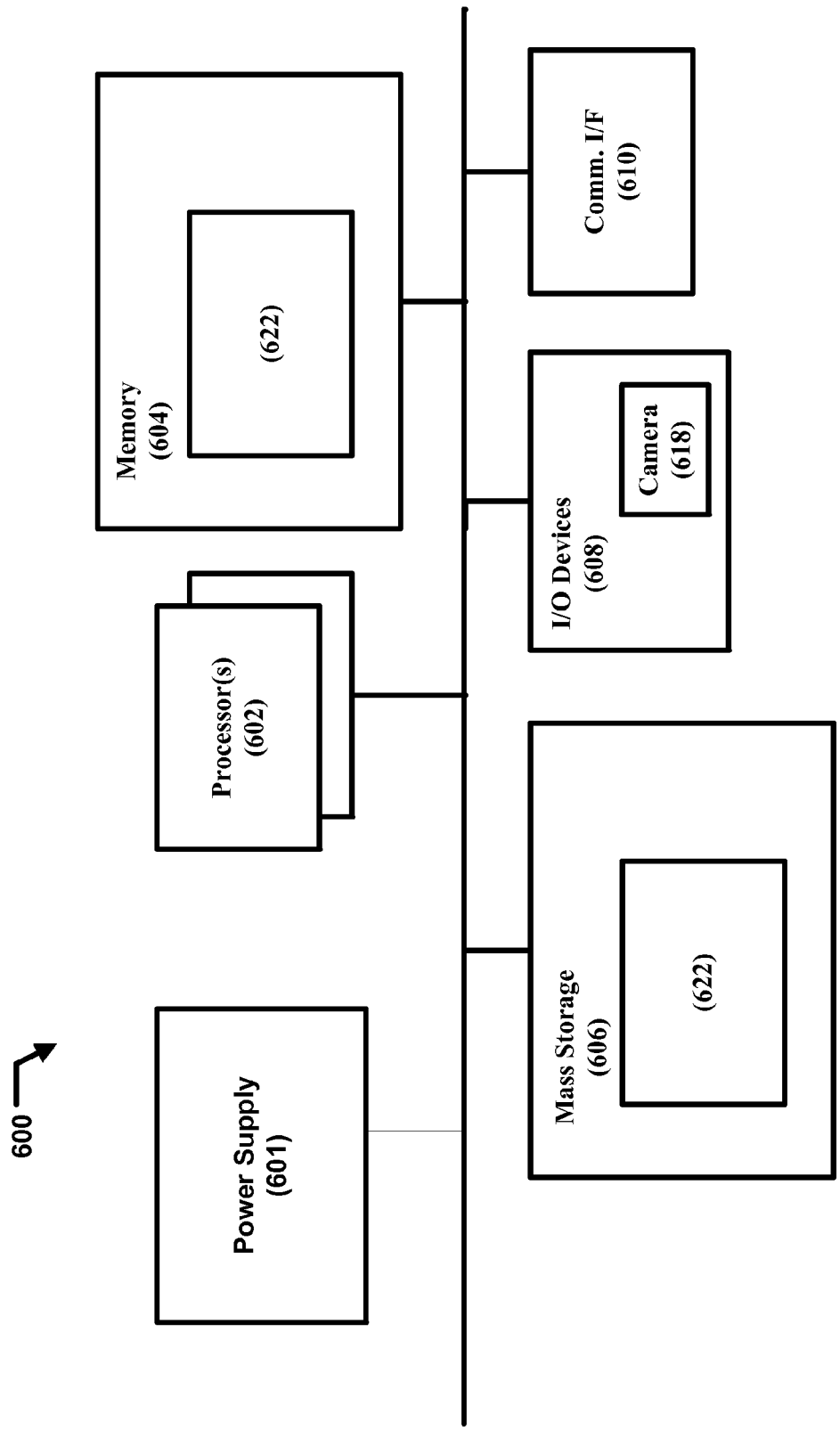
FIG. 6 is a block diagram illustrates an example computer system suitable for use to practice various aspects of the described methods and/or apparatus, in accordance with embodiments of the present disclosure.

FIG. 6 illustrates an example computer system suitable for use to practice various aspects of the earlier described methods and apparatuses, in accordance with embodiments of the present disclosure. As shown, a computer system 600 may include a power supply unit 601, a number of processors or processor cores 602, a system memory 604, a mass storage 606, and a communication interface 610. For the purpose of this application, including the claims, the terms "processor" and "processor cores" may be considered synonymous, unless the context clearly requires otherwise.

In various embodiments of the present disclosure, at least one of the processors 602 may include various regions dedicated for specific functionalities, such as the MC region and the DDR I/O region as illustrated in FIG. 1. The processor may further include the circuit 100 as previously described to facilitate data transmission between the regions.

Additionally, the computing system 600 may include one or more tangible, non-transitory computer-readable mass storage devices 606 (such as diskette, hard drive, compact disc read only memory (CDROM) and so forth), input/output devices 608 (such as keyboard, cursor control and so forth). In various embodiments, the I/O devices 608 may include one or more cameras 618. The elements may be coupled to each other and to the earlier enumerated elements via system bus 612, which represents one or more buses. In the case of multiple buses, they may be bridged by one or more bus bridges (not shown). Data may pass through the system bus 612 from the I/O devices 608, for example, from the camera 618, to the processors 602.

The system memory 604 and the mass storage 606 may be employed to store a working copy and a permanent copy of the programming instructions implementing one or more operating systems, firmware modules or drivers, applications, and so forth, herein collectively denoted as 622. The permanent copy of the programming instructions may be placed into the permanent storage 606 in the factory, or in the field, through, for example, a distribution medium (not shown), such as a compact disc (CD), or through the communication interface 610 (from a distribution server (not shown)). That is, one or more distribution media having an implementation of the agent program may be employed to distribute the agent and program various computing devices.

The remaining constitution of these elements 601-622 are known, and accordingly will not be further described.

Although specific embodiments have been illustrated and described herein, it will be appreciated by those of ordinary skill in the art that a wide variety of alternate and/or equivalent implementations may be substituted for the specific embodiments shown and described, without departing from the scope of the embodiments of the present disclosure. This application is intended to cover any adaptations or variations of the embodiments discussed herein. Therefore, it is manifestly intended that the embodiments of the present disclosure be limited only by the claims and the equivalents thereof.

What is claimed is:

1. An integrated circuit, comprising:
a circuit cell disposed on the integrated circuit, wherein the circuit cell is configured to:
receive at least a portion of a data signal from a transmitting region of the integrated circuit, the data signal associated with a first clock signal,
receive at least a portion of a second clock signal associated with a receiving region of the integrated circuit, the second clock signal having a same frequency as the first clock signal,
transmit the received portion of the data signal to the receiving region, and
level shift the received portion of the data signal from a first voltage level associated with the transmitting region to a second voltage level associated with the receiving region.

2. The integrated circuit of claim 1, further comprising a memory cell coupled to the circuit cell, wherein the memory cell includes two inverters coupled circularly in a loop.

3. The integrated circuit of claim 1, wherein the second clock signal interleaves the first clock signal.

4. The integrated circuit of claim 1, wherein the circuit cell includes a first, second, third and fourth transistors, and wherein:
the first transistor is coupled to the second transistor in series;
the third transistor is coupled to the fourth transistor in series;
the first and the third transistors are configured to receive respectively the at least a portion of the data signal; and
the second and the fourth transistors are configured to receive respectively the at least a portion of the second clock signal.

5. An integrated circuit comprising:
a circuit cell disposed on the integrated circuit, wherein the circuit cell is configured to:
receive at least a portion of a data signal from a transmitting region of the integrated circuit, the data signal associated with a first clock signal,
receive at least a portion of a second clock signal associated with a receiving region of the integrated circuit, the second clock signal having a same frequency as the first clock signal, and
transmit the received portion of the data signal to the receiving region;
wherein the at least a portion of a data signal associated with a first clock signal includes a portion of the data signal associated with even numbered pulses of the first clock signal, and wherein the at least a portion of a second clock signal includes even numbered pulses of the second clock signal.

6. The integrated circuit of claim 5, further comprising another circuit cell coupled to the first circuit cell, the another circuit cell including a fifth, sixth, seventh, and eighth transistors, wherein:
the fifth transistor is coupled to the sixth transistor in series;
the seventh transistor is coupled to the eighth transistor in series;
the fifth and the seventh transistors are respectively configured to receive a portion of the data signal associated with odd numbered pulses of the first clock signal; and
the sixth and the eighth transistors are respectively configured to receive a portion of the second clock signal associated with odd numbered pulses of the second clock signal.

7. The integrated circuit of claim 4, wherein the first and the third transistors are configured to receive respectively the at least a portion of the data signal further comprises the first transistor is configured to receive the at least a portion of the data signal, and the third transistor is configured to receive the at least a portion of the data signal via an inverter.

8. The integrated circuit of claim 1, further comprising a latch coupled to an output node of the first circuit cell to improve stability of the transmitted data signal.

9. A method, comprising:
receiving a first portion and a second portion of a data signal from a transmitting region of an integrated circuit (IC) associated with a first clock signal;
receiving a first portion and a second portion of a second clock signal associated with a receiving region of the IC, wherein the second clock signal has a same frequency as the first clock signal;
generating a first portion of an output signal based on the first portion of the data signal and the first portion of the second clock signal; and
generating a second portion of the output signal based on the second portion of the data signal and the second portion of the second clock signal.

10. The method of claim 9, further comprising multiplexing the first and the second portion of the output signal into the output signal, wherein the data signal is associated with a first voltage level, and the output signal is associated with a second voltage level different from the first voltage level.

11. The method of claim 9, further comprising:
generating a first portion and a second portion of the first clock signal, wherein the first and the second portions of the first clock signal corresponds to even numbered clock cycles and odd numbered clock cycles of the first clock signal, respectively;
generating the first portion of the data signal based on the first portion of the first clock signal; and
generating the second portion of the data signal based on the second portion of the first clock signal.

12. The method of claim 9, further comprising:
generating the first portion of the second clock signal based on even numbered clock cycles of the second clock signal; and
generating the second portion of the second clock signal based on odd numbered clock cycles of the second clock signal.

13. The method of claim 12, wherein the first portion of the second clock signal interleaves with the first portion of the first clock signal; and wherein the second portion of the second clock signal interleaves with the second portion of the first clock signal.

14. The method of claim 9, wherein said generating a first and a second portions of an output signal further comprises generating the first and the second portions of the output signal at an output node of a memory cell.

15. A system, comprising:
a system memory; and
a processor communicatively coupled to the system memory, the processor including:
a circuit cell configured to:
receive at least a portion of a data signal from a transmitting region of the processor associated with a first clock signal,
receive at least a portion of a second clock signal associated with a receiving region of the processor, the second clock signal having a same frequency as the first clock signal,
transmit the received portion of the data signal from the transmitting region to the receiving region;
wherein the circuit cell includes a first, second, third and fourth transistors, and wherein:
the first transistor is coupled to the second transistor in series;
the third transistor is coupled to the fourth transistor in series;
the first and the third transistors are configured to receive respectively the at least a portion of the data signal; and
the second and the fourth transistors are configured to receive respectively the at least a portion of the second clock signal.

16. The system of claim 15, wherein the at least a portion of a data signal associated with a first clock signal includes a portion of the data signal associated with even numbered pulses of the first clock signal, and wherein the at least a portion of a second clock signal includes even numbered pulses of the second clock signal.

17. The system of claim 15, wherein the processor further include a memory cell coupled to the circuit cell, wherein the memory cell includes two inverters circularly coupled in a loop.

18. The system of claim 16, further comprising another circuit cell coupled to the inverter feedback loop, the another circuit cell including a fifth, sixth, seventh, and eighth transistors, wherein:
the fifth transistor is coupled to the sixth transistor in series;
the seventh transistor is coupled to the eighth transistor in series;
the fifth and the seventh transistors are respectively configured to receive a portion of the data signal associated with odd numbered pulses of the first clock signal; and
the sixth and the eighth transistors are respectively configured to receive a portion of the second clock signal associated with odd numbered pulses of the second clock signal.

* * * * *